US011012061B1

United States Patent
Lin

(10) Patent No.: US 11,012,061 B1
(45) Date of Patent: May 18, 2021

(54) SELF-CALIBRATING LOW-NOISE DUTY CYCLE CORRECTION CIRCUIT AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/896,364

(22) Filed: Jun. 9, 2020

(51) Int. Cl.
| | |
|---|---|
| *H03K 5/156* | (2006.01) |
| *H03K 3/017* | (2006.01) |
| *H02M 3/335* | (2006.01) |
| *H03K 19/0185* | (2006.01) |
| *H03L 7/087* | (2006.01) |
| *H03K 7/08* | (2006.01) |
| *H02M 1/00* | (2006.01) |

(52) U.S. Cl.
CPC ...... *H03K 5/1565* (2013.01); *H02M 3/33569* (2013.01); *H03K 3/017* (2013.01); *H03K 7/08* (2013.01); *H03K 19/018521* (2013.01); *H03L 7/087* (2013.01); *H02M 2001/007* (2013.01)

(58) Field of Classification Search
None
See application file for complete search history.

(56) References Cited

U.S. PATENT DOCUMENTS

| | | | | | |
|---|---|---|---|---|---|
| 6,501,313 | B2* | 12/2002 | Boerstler | ............. | H03K 5/1565 |
| | | | | | 327/175 |
| 6,573,777 | B2* | 6/2003 | Saint-Laurent | ...... | H03H 11/265 |
| | | | | | 327/270 |
| 6,844,766 | B2* | 1/2005 | Sun | ...................... | H03H 11/265 |
| | | | | | 327/158 |
| 6,897,696 | B2* | 5/2005 | Chang | .................. | H03K 5/1506 |
| | | | | | 327/175 |
| 7,616,038 | B2* | 11/2009 | Oh | ....................... | H03K 5/1565 |
| | | | | | 327/172 |
| 7,913,199 | B2* | 3/2011 | Boerstler | ............. | H03K 5/1565 |
| | | | | | 716/100 |

\* cited by examiner

*Primary Examiner* — Jeffery S Zweizig
(74) *Attorney, Agent, or Firm* — McClure, Qualey & Rodack, LLP

(57) ABSTRACT

A circuit includes a core circuit configured to receive an input clock and output and output clock in accordance with a control signal, the core circuit having an encoder configured to encode the control signal into a plurality of control words and a plurality of duty cycle correction buffers configured in a cascade topology and controlled by said plurality of control words, respectively; a duty cycle detection circuit configured to output a logical signal in accordance with a comparison of a duty cycle of the output clock with a target value; and a controller configured to output the control signal in accordance with the logical signal.

20 Claims, 3 Drawing Sheets

100

SELF-CALIBRATING LOW-NOISE DUTY CYCLE CORRECTION CIRCUIT AND METHOD THEREOF

CROSS-REFERENCE TO RELATED APPLICATION

The present application includes subject matter that is related to co-pending application Ser. No. 16/876,165, filed May 18, 2020, which is hereby incorporated by reference.

BACKGROUND OF THE DISCLOSURE

Field of the Disclosure

The present disclosure generally relates to duty cycle correction and more particularly to circuits and methods for duty cycle correction that effectively reduce flicker and power supply noise.

Description of Related Art

Many modern electronic circuits require a precise clock for proper operation. A clock is a voltage signal that periodically toggles back and forth between a low level and a high level. A percentage of time that the voltage signal stays in the high level is called a duty cycle. Many circuits require a specific duty cycle for a clock to provide an optimal performance. For instance, in a multi-phase clock system wherein both a rising edge and a falling edge of a clock is used, a 50% duty cycle is usually desired. However, an actual duty cycle of a clock may deviate from a desired value. A duty cycle correction circuit is often used to make a clock have approximately a desired duty cycle.

As described in co-pending application Ser. No. 16/876,165, what is desired is a duty cycle correction circuit that can effectively alleviate a flicker noise and a noise in the power supply or ground.

BRIEF DESCRIPTION OF THIS DISCLOSURE

In an embodiment, a circuit is disclosed, the circuit comprising: a core circuit configured to receive an input clock and output and output clock in accordance with a control signal, the core circuit comprising an encoder configured to encode the control signal into a plurality of control words and a plurality of duty cycle correction buffers configured in a cascade topology and controlled by said plurality of control words, respectively; a duty cycle detection circuit configured to output a logical signal in accordance with a comparison of a duty cycle of the output clock with a target value; and a controller configured to output the control signal in accordance with the logical signal, wherein: a sum of said plurality of control words is equal to a value of the control signal; each of said plurality of duty cycle correction buffers is controlled by a respective control word among said plurality of control words and comprises a cascade of a first inverting buffer comprising a first PMOS (p-channel metal oxide semiconductor) transistor, a first P-type tunable resistor, a first NMOS (n-channel metal oxide semiconductor) transistor, and a first N-type tunable resistor and a second inverting buffer comprising a second PMOS transistor, a second P-type tunable resistor, a second NMOS transistor, and a second N-type tunable resistor; and an increase of a value of the respective control word leads to an increase in a difference in resistance between the first P-type tunable resistor and the first N-type tunable resistor and also an increase in a difference in resistance between the second N-type resistor and the second P-type resistor to be larger.

In an embodiment, a method is disclosed, the method comprising: converting an input clock into an output clock in accordance with a control signal using a core circuit comprising an encoder configured to encode the control signal into a plurality of control words and a plurality of duty cycle correction buffers configured in a cascade topology and controlled by said plurality of control words; using a duty cycle detection circuit to output a logical signal in accordance with a comparison a duty cycle of the output clock with a target value; and updating the control signal in accordance with the logical signal, wherein: a sum of said plurality of control words is equal to a value of the control signal; each of said plurality of duty cycle correction buffers is controlled by a respective control word among said plurality of control words and comprises a cascade of a first inverting buffer comprising a first PMOS transistor, a first P-type tunable resistor, a first NMOS transistor, and a first N-type tunable resistor and a second inverting buffer comprising a second PMOS transistor, a second P-type tunable resistor, a second NMOS transistor, and a second N-type tunable resistor; and an increase in a value of the respective control word leads to an increase in a difference in resistance between the first P-type tunable resistor and the first N-type tunable resistor and also an increase in a difference in resistance between the second N-type resistor and the second P-type resistor.

DETAILED DESCRIPTION OF THIS DISCLOSURE

Figure 1:
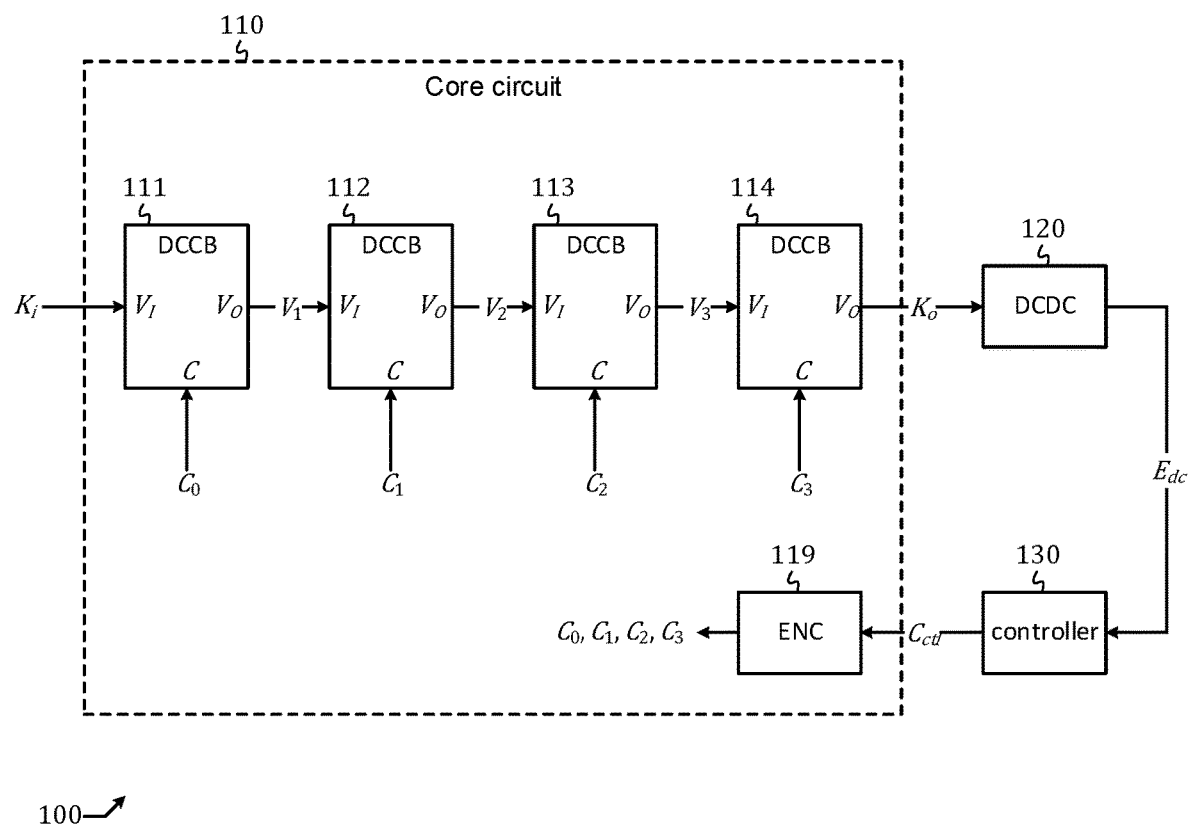
FIG. 1 shows a schematic diagram of self-calibrating duty cycle correction circuit in accordance with an embodiment of the present disclosure.

The present disclosure is directed to duty cycle correction. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "power supply," "ground," "CMOS (complementary metal oxide semiconductor)," "NMOS (n-channel metal oxide semiconductor)," "PMOS (p-channel metal oxide semiconductor)," "resistor," "resistance," and "switch." Terms like these are used in a context of microelectronics, and the associated concepts are apparent to those of ordinary skills in the art and thus will not be explained in detail here.

Those of ordinary skill in the art can recognize a resistor symbol and can recognize a MOS (metal-oxide semiconductor) transistor symbol, for both PMOS transistor and NMOS transistor, and identify the "source," the "gate," and the "drain" terminals thereof. Those of ordinary skills in the art can read schematics of a circuit comprising resistors, NMOS transistors, and PMOS transistors, and do not need a verbose description about how one transistor or resistor connects with another in the schematics. Those of ordinary skills in the art understand units such as V (Volt), micron (μm), nanometer (nm), and Ohm.

This present disclosure is disclosed in terms of an engineering sense. For instance, regarding two variables X and Y, when it is said that "X is equal to Y," it means that "X is approximately equal to Y," i.e. "a difference between X and Y is smaller than a specified engineering tolerance." When it is said that "X is zero," it means that "X is approximately zero," i.e. "X is smaller than a specified engineering tolerance." When it is said that "X is substantially smaller than Y," it means that "X is negligible with respect to Y," i.e. "a ratio between X and Y is smaller than an engineering tolerance and therefore X is negligible when compared to Y."

Throughout this disclosure, "$V_{DD}$" denotes a power supply node, and "$V_{SS}$" denotes a ground node. Note that a ground node is a node at which a voltage level is substantially zero, and a power supply node is a node at which a voltage level is substantially stationary and higher than zero. In this disclosure, depending on a context that is apparent to those of ordinary skill in the art, sometimes $V_{DD}$ refers to the voltage level at the power supply node $V_{DD}$, while $V_{SS}$ sometimes refers to the voltage level at the power supply node $V_{SS}$. For instance, it is apparent that when we say "$V_{DD}$ is 1.05V" we mean that the voltage level at the power supply node $V_{DD}$ is 1.05V.

In this present disclosure, a signal is a voltage of a variable level that can vary with time, or a number with a value that can vary with time. When a signal is a voltage, it is called a voltage signal and a level of the signal at a moment represents a state of the signal at that moment. When a signal is a number, it is called a numerical signal, and a value of the signal at a moment represents a state of the signal at that moment.

A logical signal is a voltage signal of two states: a low state and a high state. The low state is also referred to as a "0" state, while the high stage is also referred to as a "1" state. Regarding a logical signal Q, when we say, "Q is high" or "Q is low," what we mean is "Q is in the high state" or "Q is in the low state." Likewise, when we say, "Q is 1" or "Q is 0," what we mean is "Q is in the 1 state" or "Q is in the 0 state."

When a logical signal toggles from low to high, it undergoes a low-to-high transition. When a logical signal toggles from high to low, it undergoes a high-to-low transition.

When a MOS transistor is used to embody a switch, it is controlled by a control signal that is a logical signal applied at a gate of the MOS transistor. A switch embodied by a NMOS transistor is in an "on" state when the control signal is high, and in an "off" state when the control signal is low. A switch embodied by a PMOS transistor is in an "on" state when the control signal is low, and in an "off" state when the control signal is high. A MOS transistor has a resistance called "on-resistance" when it is in the "on" state, and a resistance called "off-resistance" when it is in the "off" state. An off-resistance of a MOS transistor is substantially greater than an on-resistance of the MOS transistor.

A first logical signal is said to be a logical inversion of a second logical signal, if the first logical signal and the second logical signal are always in opposite states. That is, when the first logical signal is low, the second logical signal is high; when the first logical signal is high, the second logical signal is low. When a first logical signal is said to be a logical inversion of a second logical signal, the first logical signal and the second logical signal are said to be complementary to each other.

A digital word is a numerical signal of an integer value that can be embodied by a collection of a plurality of logical signals in accordance with a certain encoding scheme. When a first digital word and a second digital word are both bounded between 0 and a maximum value and a sum of the first digital word and the second digital word is equal to the maximum value, then the first digital word and the second digital word are said to be complementary to each other.

A circuit is a collection of a transistor, a resistor, and/or other electronic devices inter-connected in a certain manner to embody a certain function.

An inverting buffer is a circuit configured to receive a first logical signal and output a second logical signal that is a logical inversion of the first logical signal. An inverting buffer comprises a pull-up circuit and a pull-down circuit. A high-to-low transition of the first logical signal activates the pull-up circuit to pull up the second logical signal to a voltage level of a power supply node, resulting in a low-to-high transition of the second logical signal. A low-to-high transition of the first logical signal activates the pull-down circuit to pull down the second logical signal to a voltage level of a ground node, resulting in a high-to-low transition of the second logical signal. A resistance of the pull-up circuit is referred to as a pull-up resistance. A resistance of the pull-down circuit is referred to as a pull-down resistance. A time that the second logical signal takes to complete a low-to-high transition depends on the pull-up resistance, while a time that the second logical signal takes to complete a high-to-low transition depends on the pull-down resistance.

A schematic diagram of a self-calibrating duty cycle correction circuit 100 in accordance with an embodiment of the present disclosure is shown in FIG. 1. Self-calibrating duty cycle correction circuit 100 receives an input clock $K_i$ and outputs and output clock $K_o$, so that a duty cycle of the output clock $K_o$ is approximately equal to a target value $D_t$ regardless of a duty cycle of the input clock $K_i$. Self-calibrating duty cycle correction circuit 100 comprises: a core circuit 110 configured to receive the input clock $K_i$ and output and output clock $K_o$ in accordance with a control signal $C_{ctl}$; a duty cycle detection circuit (DCDC) 120 configured to receive the output clock $K_o$ and output a logical signal $E_{dc}$ in accordance with a comparison of the duty cycle of the output clock $K_o$ with the target value $D_t$; and a controller 130 configured to receive the logical signal $E_{dc}$ and output the control signal $C_{ctl}$.

The control signal $C_{ctl}$ is a numerical signal. Core circuit 110 performs a duty cycle correction function so that a duty cycle of the output clock $K_o$ differs from a duty cycle of the input clock $K_i$ by an amount determined by the control signal $C_{ctl}$, and a larger value of the control signal $C_{ctl}$ leads to a larger duty cycle of the output clock $K_o$.

For brevity, hereafter: the input clock $K_i$ is simply referred to as $K_i$; the output clock $K_o$ is simply referred to as $K_o$; the logical signal $E_{dc}$ is simple referred to as $E_d$; and the control signal $C_{ctl}$ is simply referred to as $C_{ctl}$.

DCDC 120 outputs $E_{dc}$ in accordance with the following equation:

$$E_{dc} = \begin{cases} 1 & \text{if } D_O > D_t \\ 0 & \text{otherwise} \end{cases} \quad (1)$$

Here, $D_O$ denotes the duty cycle of $K_o$.

In an embodiment, $C_{ctl}$ is an integer, and the controller 130 periodically updates a value of $C_{ctl}$ in accordance with:

$$C_{ctl}^{(new)} = \begin{cases} C_{ctl}^{(old)} - 1 & \text{if } E_{dc} = 1 \\ C_{ctl}^{(old)} + 1 & \text{otherwise} \end{cases} \quad (2)$$

Here, $C_{ctl}^{(old)}$ denotes an old value of $C_{ctl}$ before an update, while $C_{ctl}^{(new)}$ denotes a new value of $C_{ctl}$ after the update.

The core circuit 110 comprises an encoder ENC 119 configured to encode $C_{ctl}$ into a plurality of digital words, and a plurality of duty cycle correction buffers (DCCB) configured in a cascade topology and controlled by said plurality of control words, respectively. By way of example but not limitation, four duty cycle correction buffers 111, 112, 113, and 114 controlled by four digital words $C_0$, $C_1$, $C_2$, and $C_3$, respectively, are shown. All of the four duty cycle correction buffers 111, 112, 113, and 114 are instantiated from the same circuit that has an input pin labeled by "$V_I$," an output pin labeled by "$V_O$," and a control pin labeled by "C." In core circuit 110, there are three intermediate clocks $V_1$, $V_2$, and $V_3$. Each duty cycle correction buffer in core circuit 110 receives an input via its input pin "$V_I$" and outputs an output via its output pin "$V_O$" in accordance with a control word received via its control pin "C." Specifically, DCCB 111 (112, 113, 114) receives $K_i$ ($V_1$, $V_2$, $V_3$) via its input pin "$V_I$" and outputs $V_1$ ($V_2$, $V_3$, $K_o$) via its output pin "$V_O$" in accordance with a control of $C_0$ ($C_1$, $C_2$, $C_3$) received via its control pin "C." Each of the four digital words $C_0$, $C_1$, $C_2$, and $C_3$ is an integer that is between 0 and $C_{max}$, inclusively, where $C_{max}$ is an even number greater than 0. Each DCCB performs a duty cycle correction, so that there is a difference in duty cycle between a first clock received via its input pin "$V_I$" and a second clock output via its output pin "$V_O$" and an amount of the difference is controlled by a control word received via its control pin "C": a larger value of the control word leads to a larger duty cycle of the second clock.

In an embodiment, $C_{ctl}$ is encoded into the four digital words $C_0$, $C_1$, $C_2$, and $C_3$ in accordance with the following scheme:

$$C_i = \begin{cases} C_{max} & \text{if } C_{ctl} \geq (i+1) \cdot C_{max} \\ C_{ctl} - i \cdot C_{max} & \text{if } (i+1) \cdot C_{max} > C_{ctl} \geq i \cdot C_{max} \\ 0 & \text{if } C_{ctl} < i \cdot C_{max} \end{cases} \quad (3)$$

For i=0, 1, 2, 3. An encoding table for an exemplary case of $C_{max}$=6 is shown below:

| $C_{ctl}$ | 0, 1, 2, 3, 4, 5, 6 | 7, 8, 9, 10, 11, 12 | 13, 14, 15, 16, 17, 18 | 19, 20, 21, 22, 23, 24 |
|---|---|---|---|---|
| $C_0$ | 0, 1, 2, 3, 4, 5, 6 | 6 | 6 | 6 |
| $C_1$ | 0 | 1, 2, 3, 4, 5, 6 | 6 | 6 |
| $C_2$ | 0 | 0 | 1, 2, 3, 4, 5, 6 | 6 |
| $C_3$ | 0 | 0 | 0 | 1, 2, 3, 4, 5, 6 |

It is evident that a $C_{ctl}$ is equal to a sum of $C_0$, $C_1$, $C_2$, and $C_3$, and each of $C_0$, $C_1$, $C_2$, and $C_3$ either stays the same or increases when $C_{ctl}$ increases.

Figure 2:
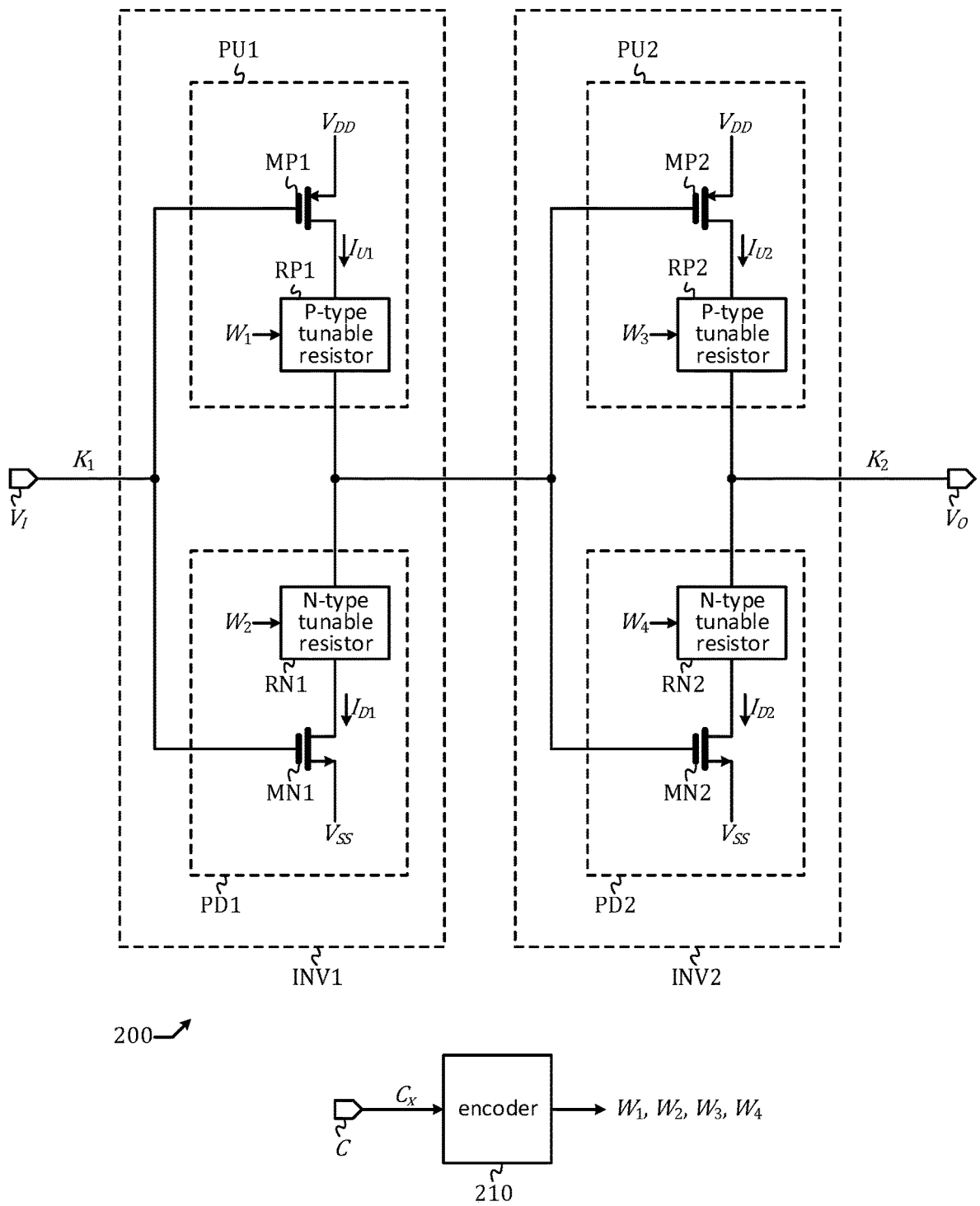
FIG. 2 shows a schematic diagram of a duty cycle correction buffer.

A schematic diagram of a duty cycle correction buffer 200 that can be instantiated to embody DCCB 111, 112, 113, and 114 is depicted in FIG. 2. Duty cycle correction buffer 200 receives a first clock $K_1$ via its input pin "$V_I$" and outputs a second clock $K_2$ via its output pin "$V_O$" in accordance with a control word $C_x$ received via its control pin "C." Duty cycle correction buffer 200 comprises a first inverting buffer INV1 and a second inverting buffer INV2. The first (second) inverting buffer INV1 (INV2) comprises a first (second) PMOS transistor MP1 (MP2), a first (second) P-type tunable resistor RP1 (RP2) controlled by a first (third) digital word $W_1$ ($W_3$), a first (second) NMOS transistor MN1 (MN2), and a first (second) N-type tunable resistor RN1 (RN2) controlled by a second (fourth) digital word $W_2$ ($W_4$). The first (second) PMOS transistor MP1 (MP2) and the first (second) P-type tunable resistor RP1 (RP2) forms a first (second) pull-up circuit PU1 (PU2); the first (second) NMOS transistor MN1 (MN2) and the first (second) N-type tunable resistor RN1 (RN2) forms a first (second) pull-down circuit PD1 (PD2). Duty cycle correction buffer 200 further comprises an encoder 210 configured to encode the control word $C_x$ into the four digital words $W_1$, $W_2$, $W_3$, and $W_4$. PMOS transistors MP1 and MP2, and NMOS transistors MN1 and MN2 all have the same on-resistance. P-type tunable resistors RP1 and RP2 are identical but controlled separately, while N-type tunable resistors RN1 and RN2 are identical but controlled separately. Except for the encoder 210, duty cycle correction buffer 200 has been disclosed and explained in detail in the co-pending application Ser. No. 16/876,165 and need not be described in detail herein. What needs to be explained is only the encoder 210.

All the four digital words $W_1$, $W_2$, $W_3$, and $W_4$ are integers ranging between 0 and inclusively, where $W_{max}=C_{max}/2$. In an embodiment, the encoder 210 embodies following encoding scheme:

$$W_1 = \begin{cases} C_x - W_{max} & \text{if } C_x > W_{max} \\ 0 & \text{otherwise} \end{cases} \quad (4)$$

$$W_2 = \begin{cases} C_x & \text{if } C_x < W_{max} \\ W_{max} & \text{otherwise} \end{cases} \quad (5)$$

$$W_3 = W_{max} - W_2 \quad (6)$$

$$W_4 = W_{max} - W_1 \quad (7)$$

An encoding table for an exemplary case of $C_{max}$=6 and thus $W_{max}$=3 is shown below:

| $C_x$ | 0 | 1 | 2 | 3 | 4 | 5 | 6 |
|---|---|---|---|---|---|---|---|
| $W_1$ | 0 | 0 | 0 | 0 | 1 | 2 | 3 |
| $W_2$ | 0 | 1 | 2 | 3 | 3 | 3 | 3 |
| $W_3$ | 3 | 2 | 1 | 0 | 0 | 0 | 0 |
| $W_4$ | 3 | 3 | 3 | 3 | 2 | 1 | 0 |

Equation (6) can be stated as: $W_3$ is complementary to $W_2$. Likewise, equation (7) can be stated as: $W_4$ is complementary to $W_1$.

As explained in the co-pending application, a resistance of P-type tunable resistor RP1 (RP2) is 0 when $W_1$ ($W_3$) is 0, and increases as $W_1$ ($W_3$) increases; a resistance of N-type tunable resistor RN1 (RN2) is 0 when $W_2$ ($W_4$) at its maximum value (3, for the example given), and increases as $W_2$ ($W_4$) decreases. When $C_x$ increases, the resistance of P-type tunable resistor RP1 controlled by $W_1$ and the resistance of the N-type tunable resistor RN2 controlled by $W_4$ either increase or stay the same, while the resistance of N-type tunable resistor RN1 controlled by $W_2$ and the resistance of the P-type tunable resistor RP2 controlled by $W_3$ either decrease or stay the same. Consequently, when c increases, a difference in a pull-up resistance of the first pull-up circuit PU1 and a pull-down resistance of the first pull-down circuit PD1 always increases, so does a difference in a pull-down resistance of the second pull-down circuit PD2 and a pull-up resistance of the second pull-up circuit PU2. Therefore, as explained in the co-pending application, the duty cycle of $K_2$ will increases when $C_x$ increases.

When $C_{ctl}$ increases, each of $C_0$, $C_1$, $C_2$, and $C_3$ either stays the same or increases, causing a duty cycle correction of DCCB 111, 112, 113, and 114 to either stay the same or increase. As a result, at duty cycle of $K_o$ always increases when $C_{ctl}$ increases.

A P-type tunable resistor (e.g. RP1 and RP2 of FIG. 2) comprises a serial connection of a plurality of resistors configured to form a conduction path and a plurality of PMOS transistors controlled by a plurality of logical signals and configured to short a part of the conduction path, wherein said plurality of logical signals collectively embody the digital word (e.g. $W_1$ and $W_3$ in FIG. 2) that controls the P-type tunable resistor. As a result, a resistance of said P-type tunable can be tuned in accordance with the digital word.

A N-type tunable resistor (e.g. RN1 and RN2 of FIG. 2) comprises a serial connection of a plurality of resistors configured to form a conduction path and a plurality of NMOS transistors controlled by a plurality of logical signals and configured to short a part of the conduction path, wherein said plurality of logical signals collectively embody the digital word (e.g. $W_2$ and $W_4$ in FIG. 2) that controls the N-type tunable resistor. As a result, a resistance of said N-type tunable can be tuned in accordance with the digital word.

Embodiments of both P-type tunable resistor and N-type tunable resistor are disclosed and explained in detail in the co-pending and thus not repeated here.

Figure 3:
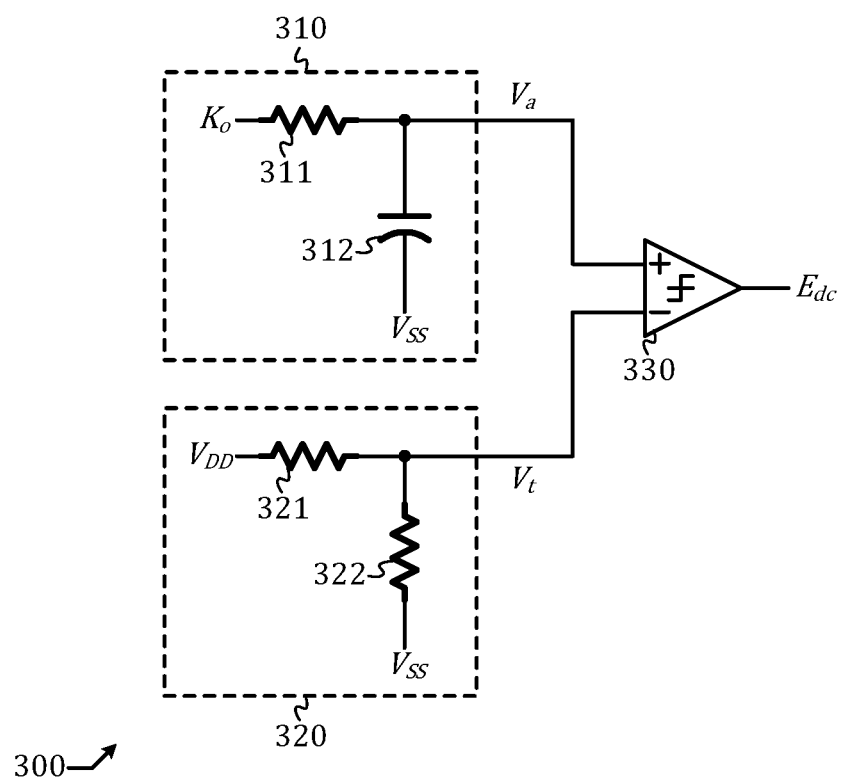
FIG. 3 shows a schematic diagram of a duty cycle detection circuit.

A schematic diagram of a duty cycle detection circuit 300 that can be used to embody DCDC 120 is shown in FIG. 3. Duty cycle detection circuit 300 comprises a low-pass filter 310 comprising resistor 311 and capacitor 312, a resistive voltage divider 320 comprising resistor 321 and resistor 322, and a comparator 330. Low-pass filter 310 receives $K_O$ and output an average voltage $V_a$ that represents a duty cycle of $K_O$. For instance, if the duty cycle of $K_O$ is 40%, $V_a$ will be approximately $0.4 \cdot V_{DD}$. Note that $V_{SS}$ is 0V. Resistive voltage divider 320 outputs a target voltage $V_t$ that presents $D_t$, the target value of the duty cycle of $K_O$. Let resistances of resistor 321 and resistor 322 be $R_{321}$ and $R_{322}$, respectively. $R_{321}$ is chosen in accordance with $$R_{321} = R_{322} \cdot \left( \frac{1}{D_t} - 1 \right) \quad (8)$$

The target voltage $V_t$ is established in accordance with $$V_t = \frac{R_{322}}{R_{321} + R_{322}} \cdot V_{DD} = D_t \cdot V_{DD} \quad (9)$$

Comparator 330 compares $V_a$ with $V_t$ and outputs $E_{dc}$, indicating whether $V_a$ is higher than $V_t$ or not. When $V_a$ is higher (lower) than $V_t$, $E_{dc}$ is 1 (0) and it indicates the duty cycle of $K_o$ is larger (smaller) than $D_t$. When the duty cycle of $K_o$ is larger (smaller) than $D_t$, $E_{dc}$ is 1 (0), controller 130 decrments (increments) the value of $C_{ctl}$, resulting in a decrement (increment) of the duty cycle of $K_o$. The duty cycle of $K_o$ is thus calibrated in a closed loop manner to be approximately equal to $D_t$.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A circuit comprising:
a core circuit configured to receive an input clock and output an output clock in accordance with a control signal, the core circuit comprising an encoder configured to encode the control signal into a plurality of control words and a plurality of duty cycle correction buffers configured in a cascade topology and controlled by said plurality of control words, respectively;
a duty cycle detection circuit configured to output a logical signal in accordance with a comparison of a duty cycle of the output clock with a target value; and
a controller configured to output the control signal in accordance with the logical signal, wherein:
a sum of said plurality of control words is equal to a value of the control signal;
each of said plurality of duty cycle correction buffers is controlled by a respective control word among said plurality of control words and comprises a cascade of a first inverting buffer comprising a first PMOS (p-channel metal oxide semiconductor) transistor, a first P-type tunable resistor, a first NMOS (n-channel metal oxide semiconductor) transistor, and a first N-type tunable resistor and a second inverting buffer comprising a second PMOS transistor, a second P-type tunable resistor, a second NMOS transistor, and a second N-type tunable resistor; and
an increase of a value of the respective control word leads to an increase in a difference in resistance between the first P-type tunable resistor and the first N-type tunable resistor and also an increase in a difference in resistance between the second N-type tunable resistor and the second P-type tunable resistor to be larger.

2. The circuit of claim 1, wherein: the respective control word is encoded into a first word, a second word, a third word, and a fourth word configured to control the first P-type tunable resistor, the first N-type tunable resistor, the second P-type tunable resistor, and the second N-type tunable resistor, respectively.

3. The circuit of claim 2, wherein the first P-type tunable resistor comprises a serial connection of a plurality of resistors configured to form a conduction path, and a plurality of PMOS transistors controlled by a plurality of logical signals encoded from the first word, respectively, and configured to short a part of the conduction path.

4. The circuit of claim 3, wherein the second P-type tunable resistor is the same circuit as the first P-type tunable resistor except that the first word is replaced by the third word.

5. The circuit of claim 4, wherein the first N-type tunable resistor comprises a serial connection of a plurality of resistors configured to form a conduction path, and a plurality of NMOS transistors controlled by a plurality of logical signals encoded from the second word, respectively, and configured to short a part of the conduction path.

6. The circuit of claim 5, wherein the second N-type tunable resistor is the same circuit as the first N-type tunable resistor except that the second word is replaced by the fourth word.

7. The circuit of claim 2, wherein the first word is complementary to the fourth word, while the second word is complementary to the third word.

8. The circuit of claim 1, wherein the first PMOS transistor, the first NMOS transistor, the second PMOS transistor, and the second NMOS transistor have approximately the same on-resistance.

9. The circuit of claim 1, wherein the duty cycle detection circuit comprises a low-pass filter configured to receive the output clock and output an average voltage representing the duty cycle of the output clock, a resistive voltage divider configured to divide down a power supply voltage into a target voltage representing the target value, and a comparator configured to output the logical signal in accordance with a difference between the average voltage and the target voltage.

10. The circuit of claim 1, wherein the controller decrements the control signal when the logical signal is high and increments the control signal when the logical signal is low.

11. A method comprising:
converting an input clock into an output clock in accordance with a control signal using a core circuit comprising an encoder configured to encode the control signal into a plurality of control words and a plurality of duty cycle correction buffers configured in a cascade topology and controlled by said plurality of control words;
using a duty cycle detection circuit to output a logical signal in accordance with a comparison a duty cycle of the output clock with a target value; and
updating the control signal in accordance with the logical signal, wherein:
a sum of said plurality of control words is equal to a value of the control signal;
each of said plurality of duty cycle correction buffers is controlled by a respective control word among said plurality of control words and comprises a cascade of a first inverting buffer comprising a first PMOS transistor, a first P-type tunable resistor, a first NMOS transistor, and a first N-type tunable resistor and a second inverting buffer comprising a second PMOS transistor, a second P-type tunable resistor, a second NMOS transistor, and a second N-type tunable resistor; and
an increase in a value of the respective control word leads to an increase in a difference in resistance between the first P-type tunable resistor and the first N-type tunable resistor and also an increase in a difference in resistance between the second N-type tunable resistor and the second P-type tunable resistor.

12. The method of claim 11, wherein: the respective control word is encoded into a first word, a second word, a third word, and a fourth word configured to control the first P-type tunable resistor, the first N-type tunable resistor, the second P-type tunable resistor, and the second N-type tunable resistor, respectively.

13. The method of claim 12, wherein the first P-type tunable resistor comprises a serial connection of a plurality of resistors configured to form a conduction path, and a plurality of PMOS transistors controlled by a plurality of logical signals encoded from the first word, respectively, and configured to short a part of the conduction path.

14. The method of claim 13, wherein the second P-type tunable resistor is the same circuit as the first P-type tunable resistor except that the first word is replaced by the third word.

15. The method of claim 14, wherein the first N-type tunable resistor comprises a serial connection of a plurality of resistors configured to form a conduction path, and a plurality of NMOS transistors controlled by a plurality of logical signals encoded from the second word, respectively, and configured to short a part of the conduction path.

16. The method of claim 15, wherein the second N-type tunable resistor is the same circuit as the first N-type tunable resistor except that the second word is replaced by the fourth word.

17. The method of claim 12, wherein the first word is complementary to the fourth word, while the second word is complementary to the third word.

18. The method of claim 11, wherein the first PMOS transistor, the first NMOS transistor, the second PMOS transistor, and the second NMOS transistor have approximately the same on-resistance.

19. The method of claim 11, wherein the duty cycle detection circuit comprises a low-pass filter configured to receive the output clock and output an average voltage representing the duty cycle of the output clock, a resistive voltage divider configured to divide down a power supply voltage into a target voltage representing the target value, and a comparator configured to output the logical signal in accordance with a difference between the average voltage and the target voltage.

20. The method of claim 11, wherein the updating comprises decrementing the control signal when the logical signal is high and incrementing the control signal when the logical signal is low.

* * * * *